United States Patent
Yaegashi

(10) Patent No.: US 9,690,185 B2
(45) Date of Patent: *Jun. 27, 2017

(54) SUBSTRATE PROCESSING METHOD, PROGRAM, COMPUTER-READABLE STORAGE MEDIUM, AND SUBSTRATE PROCESSING SYSTEM

(71) Applicant: TOKYO ELECTRON LIMITED, Tokyo (JP)

(72) Inventor: Hidetami Yaegashi, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 226 days.

This patent is subject to a terminal disclaimer.

(21) Appl. No.: 14/619,700

(22) Filed: Feb. 11, 2015

(65) Prior Publication Data

US 2015/0241787 A1    Aug. 27, 2015

(30) Foreign Application Priority Data

Feb. 26, 2014    (JP) ................................ 2014-034917

(51) Int. Cl.
| | |
|---|---|
| *G03D 5/00* | (2006.01) |
| *G03D 13/00* | (2006.01) |
| *G03F 7/039* | (2006.01) |
| *G03F 7/30* | (2006.01) |
| *G03F 7/40* | (2006.01) |
| *H01L 21/67* | (2006.01) |

(52) U.S. Cl.
CPC ............. *G03D 13/00* (2013.01); *G03F 7/039* (2013.01); *G03F 7/3021* (2013.01); *G03F 7/405* (2013.01); *H01L 21/6715* (2013.01); *H01L 21/67115* (2013.01); *H01L 21/67178* (2013.01)

(58) Field of Classification Search
USPC ......................................................... 396/611
See application file for complete search history.

(56) References Cited

U.S. PATENT DOCUMENTS

| | | | | |
|---|---|---|---|---|
| 5,928,840 A | * | 7/1999 | Matsuo | ...................... C08F 8/30 430/313 |
| 5,965,325 A | * | 10/1999 | Matsuo | ................. G03F 7/0045 430/270.1 |
| 6,017,683 A | * | 1/2000 | Endo | ..................... G03F 7/0045 430/313 |
| 9,280,052 B2 | * | 3/2016 | Iwao | ......................... G03F 7/38 |

(Continued)

FOREIGN PATENT DOCUMENTS

| | | |
|---|---|---|
| JP | 8-76385 A | 3/1996 |
| JP | 9-15864 A | 1/1997 |

(Continued)

*Primary Examiner* — Rodney Fuller
(74) *Attorney, Agent, or Firm* — Rothwell, Figg, Ernst & Manbeck, P.C.

(57) ABSTRACT

A substrate processing method performs a photolithography processing on a wafer to form a resist pattern on the wafer. Ultraviolet ray is irradiated onto the resist pattern to cut side chains of the resist pattern to improve line edge roughness of the resist pattern. A processing agent is caused to enter the resist pattern and a metal is caused to be infiltrated into the resist pattern through the processing agent. Thereafter, the wafer is heated to vaporize the processing agent from the resist pattern to form a cured resist pattern.

20 Claims, 12 Drawing Sheets

(56) References Cited

U.S. PATENT DOCUMENTS

| | | | | |
|---|---|---|---|---|
| 9,341,952 B2 * | 5/2016 | Iwao | ................. | G03F 7/405 |
| 2012/0241411 A1 * | 9/2012 | Darling | ................. | G03F 7/405 |
| | | | | 216/67 |
| 2013/0256265 A1 * | 10/2013 | Darling | ................. | G03F 7/0002 |
| | | | | 216/49 |
| 2014/0255844 A1 * | 9/2014 | Iwao | ................. | G03F 7/405 |
| | | | | 430/270.1 |
| 2014/0255852 A1 * | 9/2014 | Iwao | ................. | G03F 7/38 |
| | | | | 430/325 |

FOREIGN PATENT DOCUMENTS

| | | | | |
|---|---|---|---|---|
| JP | 2000-19733 A | 1/2000 | | |
| JP | 2001-332484 A | 11/2001 | | |
| JP | EP 1375699 A1 * | 1/2004 | ............. | C08L 83/16 |
| JP | 2005-15779 A | 1/2005 | | |
| JP | 2005-140878 A | 6/2005 | | |

* cited by examiner

SUBSTRATE PROCESSING METHOD, PROGRAM, COMPUTER-READABLE STORAGE MEDIUM, AND SUBSTRATE PROCESSING SYSTEM

CROSS-REFERENCE TO RELATED APPLICATIONS

This application is based on and claims priority from Japanese Patent Application No. 2014-034917, filed on Feb. 26, 2014, with the Japan Patent Office, the disclosure of which is incorporated herein in its entirety by reference.

TECHNICAL FIELD

The present disclosure relates to a substrate processing method that forms a resist pattern on a substrate, a program, a computer-readable storage medium, and a substrate processing system for performing the substrate processing method.

BACKGROUND

For example, in a photolithography process of a semiconductor device manufacturing process, for example, a resist coating processing of applying a resist liquid to a processing target film on a surface of a semiconductor wafer (hereinafter, referred to as a "wafer") to form a resist film, an exposure processing of irradiating a predetermined pattern of light is irradiated on the resist film on the wafer to expose the resist film, and a development process of developing the exposed resist film are sequentially performed such that a predetermined resist pattern is formed on the wafer. After the resist pattern is formed, the processing target film is etched by using the resist pattern as a mask such that the predetermined pattern is formed on the processing target film.

Due to the exposure processing, fine unevenness called line edge roughness (LER) appears on a side surface of the resist pattern formed by the photolithography processing. The unevenness of the side surface of the resist pattern is transferred onto the processing target film during the etching and the unevenness becomes impossible to ignore as high speed operation and miniaturization of a semiconductor device has progressed in recent years.

Regarding the LER, a technique is known in which, for example, the resist pattern is heated so as to improve the LER. For example, Japanese National Phase Publication No. 2001-332484 discloses a method of improving line edge roughness by irradiating ultraviolet ray on a wafer to heat a resist pattern.

SUMMARY

In order to achieve an object described above, the present disclosure provides a substrate processing method for forming a resist pattern on a substrate. The substrate processing method includes: a resist pattern forming process of forming a resist pattern on a substrate by performing a photolithography processing on the substrate; a side chain cutting process of cutting side chains of the resist pattern by irradiating energy ray on the resist pattern; and a metal processing process of causing a processing agent to enter the resist pattern in the side chains are cut, and causing a metal to be infiltrated into the resist pattern through the processing agent.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
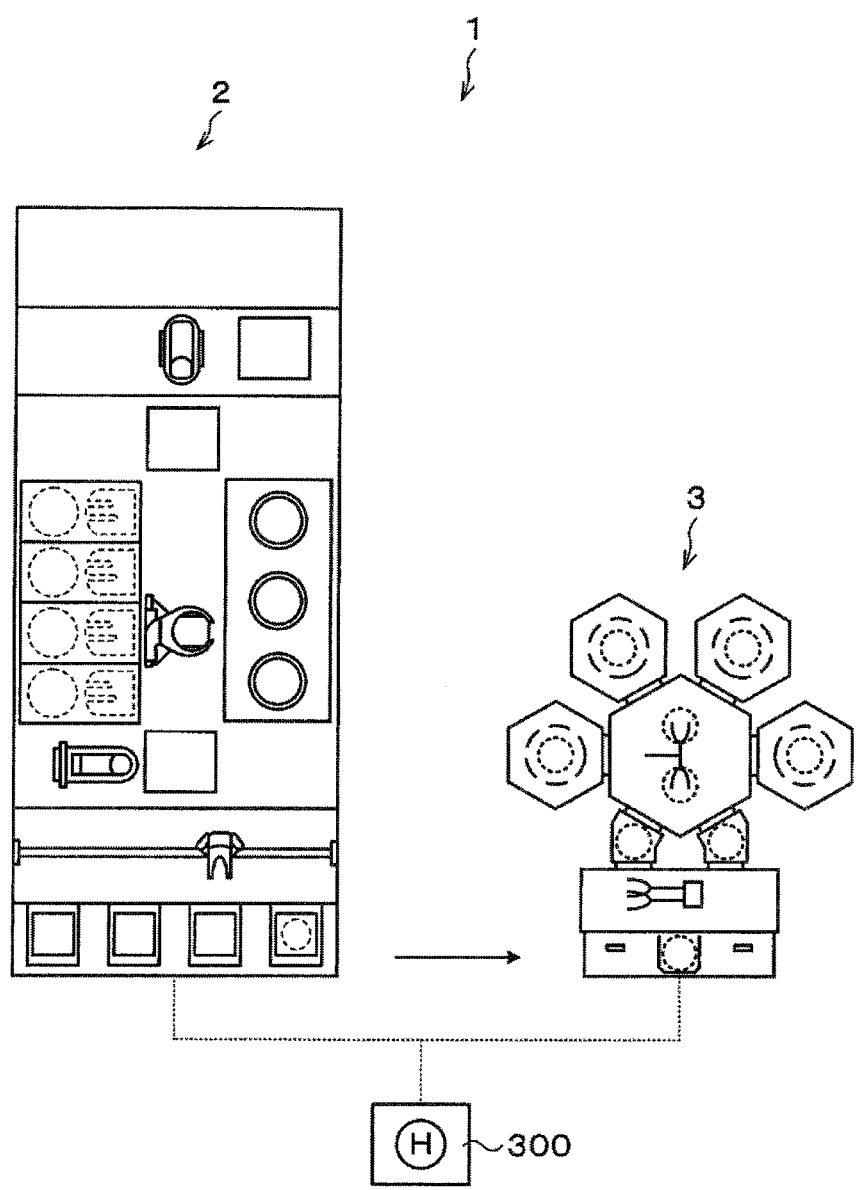
FIG. 1 is an explanatory view illustrating a schematic configuration of a substrate processing system according to an exemplary embodiment.

In the following detailed description, reference is made to the accompanying drawings, which form a part hereof. The illustrative embodiments described in the detailed description, drawing, and claims are not meant to be limiting. Other exemplary embodiments may be utilized, and other changes may be made without departing from the spirit or scope of the subject matter presented here.

In some line edge roughness improvement methods, a harmful effect such as, for example, damage of rectangularity of a resist pattern or reduction of a height of a resist pattern, may occur. Further, in some cases, side chains of a resist are cut and thus, the etching resistance of a resist pattern may be reduced. In this case, an etching selection ratio for a processing target film is reduced and thus, it becomes difficult to form a desired pattern on the processing target film. In particular, since an aspect ratio of a pattern becomes larger as the semiconductor device is miniaturized in recent years, the reduction of the selection ratio becomes a significant problem.

The present disclosure has been made in consideration of the problems described above and is intended to improve the line edge roughness of a resist pattern without reducing the etching resistance of the resist pattern.

In order to achieve the object, In order to achieve an object described above, the present disclosure provides a substrate processing method for forming a resist pattern on a substrate. The substrate processing method includes: a resist pattern forming process of forming a resist pattern on a substrate by performing a photolithography processing on the substrate; a side chain cutting process of cutting side chains of the resist pattern by irradiating energy ray on the resist pattern; and a metal processing process of causing a processing agent to enter the resist pattern in the side chains are cut, and causing a metal to be infiltrated into the resist pattern through the processing agent.

According to the present disclosure, since the processing agent enters the resist pattern in the metal processing process, the metal may enter the resist pattern using the processing agent as an entering pathway. Also, the metal which has entered the resist pattern is bonded to the side chains, which are cut in the side chain cutting process, of the resist pattern. As a result, the metal is infiltrated into the resist pattern and as a result, the metal-containing resist pattern is formed. The resist pattern which contains the metal has a high etching resistance and has a high etching selection ratio in relation to the processing target film on the substrate. Accordingly, an etching processing may be performed on the processing target film using the resist pattern as a mask such that a pattern having a high aspect ratio may be formed on the processing target film.

Further, when the energy ray is irradiated on the resist pattern in the side chain cutting process, the unevenness of the side surface of the resist pattern may be smoothened. Therefore, according to the present disclosure, it is possible to form a resist pattern having improved line edge roughness while maintaining the high etching resistance.

The energy ray may be at least one of the ultraviolet ray and the electron beam which have a wavelength of 184 nm or less.

The irradiation of the energy ray may be performed within an oxygen atmosphere.

In the metal processing process, an infiltration amount of the metal infiltrated into the resist pattern is controlled by adjusting at least one of: a time period during which the metal is infiltrated into the metal in the metal processing process, a temperature of the processing agent in the metal processing process, an amount of solvent contained in the resist pattern processed in the metal processing process, and an irradiation amount of the energy ray irradiated in the side chain cutting process.

The processing agent may be at least one of a metal alkoxide, a metal acylate, and a metal chelate.

In the metal processing process, the processing agent may be supplied onto the substrate in a liquid state or a gaseous state.

In the metal processing process, the processing agent may be supplied onto the substrate to cause the processing agent to enter the resist pattern, and then a metal-containing agent containing the metal may be supplied onto the substrate to cause the metal to be infiltrated into the resist pattern.

The processing agent may be alcohol.

In the metal processing process, each of the processing agent and the metal-containing agent may be supplied onto the substrate in a liquid state or a gaseous state.

According to another aspect of the present disclosure, there is provided a program runs on a computer of a control device that controls a substrate processing system to execute the substrate processing method described above.

According to still another aspect of the present disclosure, a computer-readable storage medium stored with the program described above is provided.

According to still yet another aspect of the present disclosure, there is provided a substrate processing system that forms a resist pattern on a substrate is provided. The substrate processing system includes: a developing apparatus configured to perform a development processing on a resist film after an exposure apparatus to form a resist pattern on a substrate; an energy ray irradiation apparatus configured to irradiate energy ray onto the resist pattern; and a metal processing apparatus configured to cause a processing agent to enter the resist pattern and to cause a metal to be infiltrated into the resist pattern through the processing agent.

The energy ray may be at least one of ultraviolet ray and electron beam which have a wavelength of 184 nm or less.

Energy ray irradiation may be performed within an oxygen atmosphere.

The substrate processing system may further include a control device configured to control at least one of: an amount of infiltration of the metal infiltrated the resist pattern by adjusting at least a time period during which the metal is infiltrated into the resist in the metal processing process, a temperature of the processing agent in the metal processing process, an amount of solvent contained in the resist pattern processed in the metal processing process, and an irradiation amount of the energy ray irradiated in the side chain cutting process.

The processing agent may be at least one of a metal alkoxide, a metal acylate, and a metal chelate.

The metal processing apparatus may include a processing agent supplying unit configured to supply the processing agent onto the substrate.

The processing agent supplying part may supply the processing agent onto the substrate in a liquid state or a gaseous state.

The metal processing apparatus may include a processing agent supplying unit configured to supply the processing agent onto the substrate and a metal-containing agent supplying unit configured to supply a metal-containing agent containing the metal onto the substrate.

The processing agent supplying unit and the metal-containing agent supplying unit respectively supply the processing agent and the metal-containing agent onto the substrate in a liquid state or gaseous state.

The processing agent may be alcohol.

According to the present disclosure, it is possible to improve line edge roughness of a resist pattern without reducing the etching resistance of the resist pattern.

Hereinafter, descriptions will be made on an exemplary embodiment of the present disclosure. FIG. 1 is an explanatory view illustrating a schematic configuration of a substrate processing system 1 according to an exemplary embodiment. In the meantime, a processing target film is formed on a wafer as a substrate to be processed in the substrate processing system 1 of the exemplary embodiment in advance, as will be described below.

As illustrated in FIG. 1, the substrate processing system 1 includes a coating and developing apparatus 2 which performs a photolithography processing on a wafer and an etching apparatus 3 which performs an etching processing on the wafer.

Figure 2:
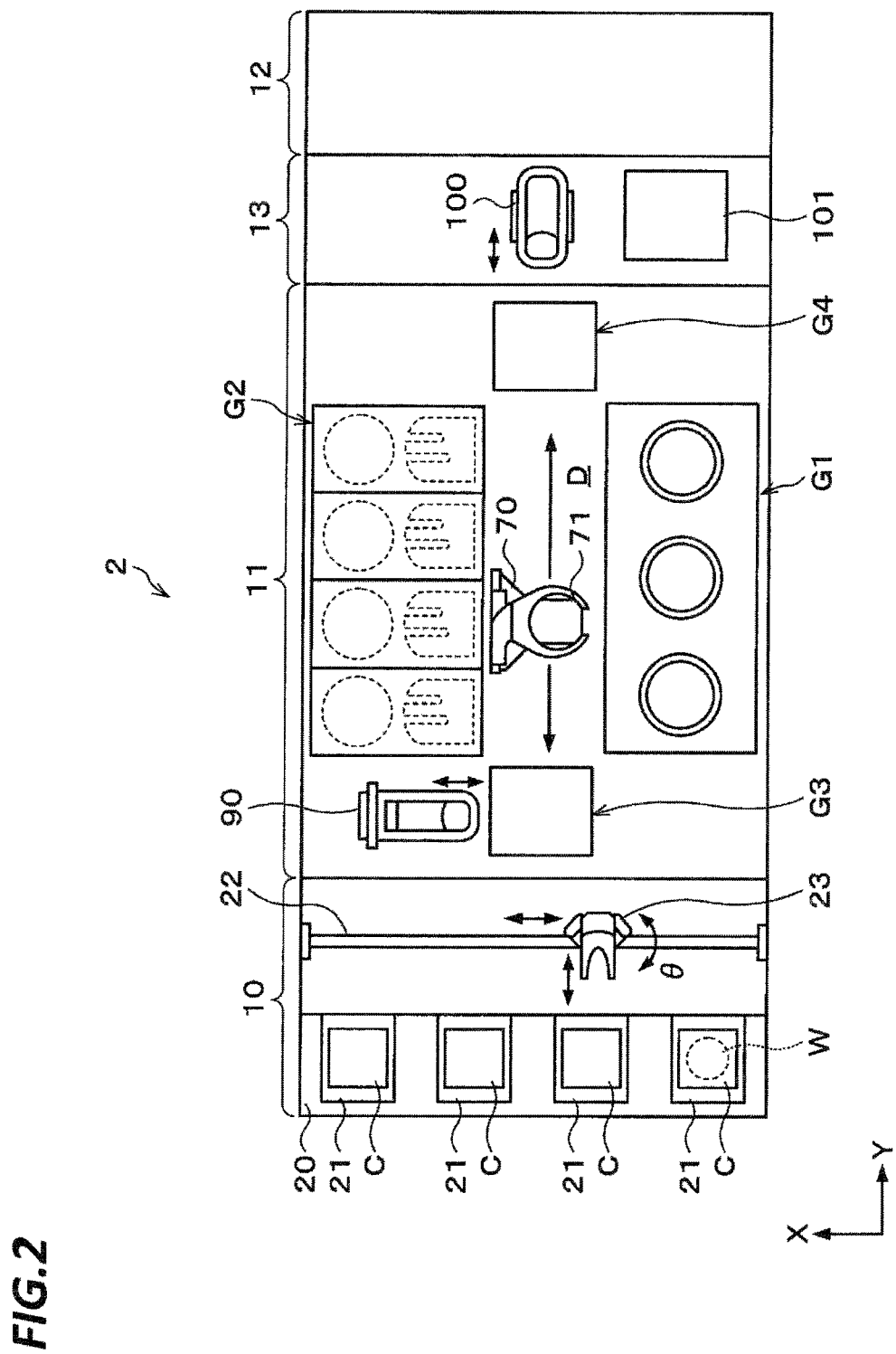
FIG. 2 is a plane view illustrating a schematic configuration of a coating and developing apparatus.

As illustrated in FIG. 2, the coating and developing apparatus 2 has a configuration including, for example, a cassette station 10, a processing station 11, and an interface station 13 which are integrally connected with each other. The cassette station 10 is configured such that carry-in/carry-out of a cassette C accommodating a plurality of wafers W is performed between the cassette station 10 and the outside, the processing station 11 is provided with a plurality of various processing apparatuses each of which performs a predetermined processing for a single wafer during the photolithography processing, and the interface station 13 is positioned adjacent to the processing station 11 to deliver a wafer W between the processing station 11 and the exposure apparatus 12.

A cassette placing table 20 is provided in the cassette station 10. A plurality of cassette placement plates 21, for example, four cassette placement plates 21 are provided on the cassette placing table 20. The cassette placement plates 21 are arranged side by side in one row in the horizontal direction which corresponds to the X direction (vertical direction in FIG. 2). A cassette C may be disposed on each cassette placement plate 21 when the cassette C is carried in/carried out from/to the outside of the coating and developing apparatus 2.

As illustrated in FIG. 2, a wafer conveyance apparatus 23 which is movable on a conveyance path 22 extending in the X direction is provided in the cassette station 10. The wafer conveyance apparatus 23 is also movable in the vertical direction and around the vertical axis (θ direction) to convey the wafer W between the cassette C placed on a cassette placement plate 21 and a delivery apparatus of a third block G3 of the processing station 11 which will be described later.

The processing station 11 is provided with a plurality of blocks, for example, four blocks G1, G2, G3, G4, each of which is provided with various apparatuses. For example, the first block G1 is provided at a front side (negative X direction in FIG. 2) of the processing station 11 and the second block G2 is provided at a rear side (positive X direction in FIG. 2) of the processing station 11. Further, the third block G3 is provided at the cassette station 10 side (negative Y direction in FIG. 2) of the processing station 11 and the fourth block G4 is provided at the interface station 13 side (positive Y direction in FIG. 2) of the processing station 11.

Figure 3:
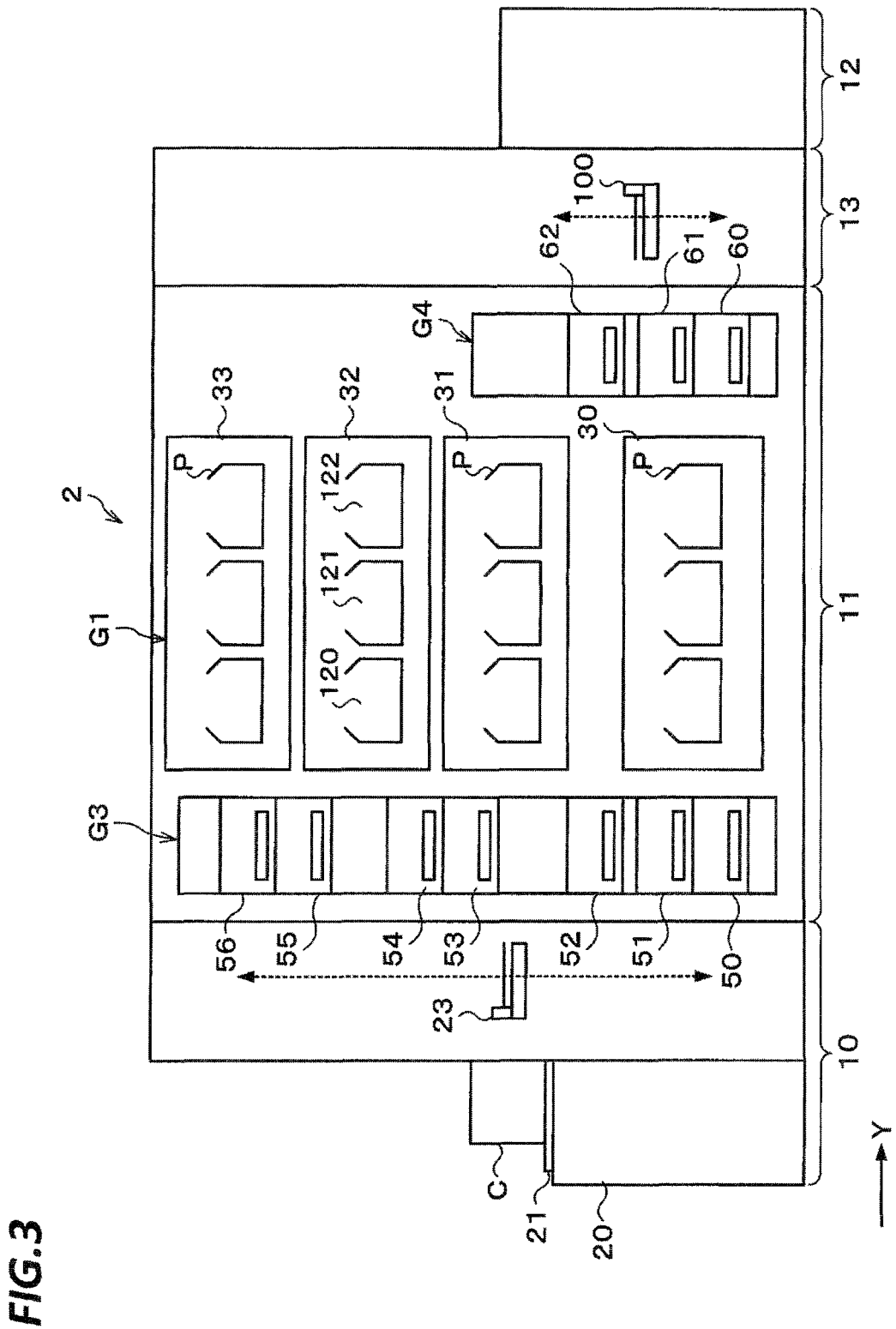
FIG. 3 is a side view illustrating a schematic internal configuration of the coating and developing apparatus.

A plurality of liquid processing apparatuses are stacked in, for example, the first block G1 in the vertical direction as illustrated in FIG. 3. For example, a developing apparatus 30 which performs a development process on the wafer W, a lower anti-reflection film forming apparatus 31 which forms an anti-reflection film on a lower layer of a resist film of the wafer W (hereinafter, referred to as a "lower anti-reflection film"), a coating apparatus 32 functioning as a metal processing apparatus which forms the resist film on the wafer W and allows a metal to be infiltrated into the resist pattern, and an upper anti-reflection film forming apparatus 33 which forms an anti-reflection film on an upper layer of the resist film of the wafer W (hereinafter, referred to as an "upper anti-reflection film") are stacked in this order from the bottom to form a four-stage configuration.

Each of the developing apparatus 30, the lower anti-reflection film forming apparatus 31, and the upper anti-reflection film forming apparatus 33 has a plurality of cups P in the horizontal direction, each of which accommodates a wafer W during the processing and is capable of performing a plurality of wafers W in parallel. Detailed configuration of the coating apparatus 32 will be described later.

In the meantime, the number or the arrangement of the developing apparatus 30, the lower anti-reflection film forming apparatus 31, the coating apparatus 32, and the upper anti-reflection film forming apparatus 33 may be arbitrarily selected. Further, in the first block G1, for example, a protective film forming apparatus which supplies a processing liquid for forming a water-repellent protective film to each wafer W to form a protective film for exposure, or a rear surface cleaning apparatus which supplies a cleaning liquid to a peripheral bevel section of a rear surface of each wafer W to clean the rear surface of the wafer W may be disposed.

Figure 4:
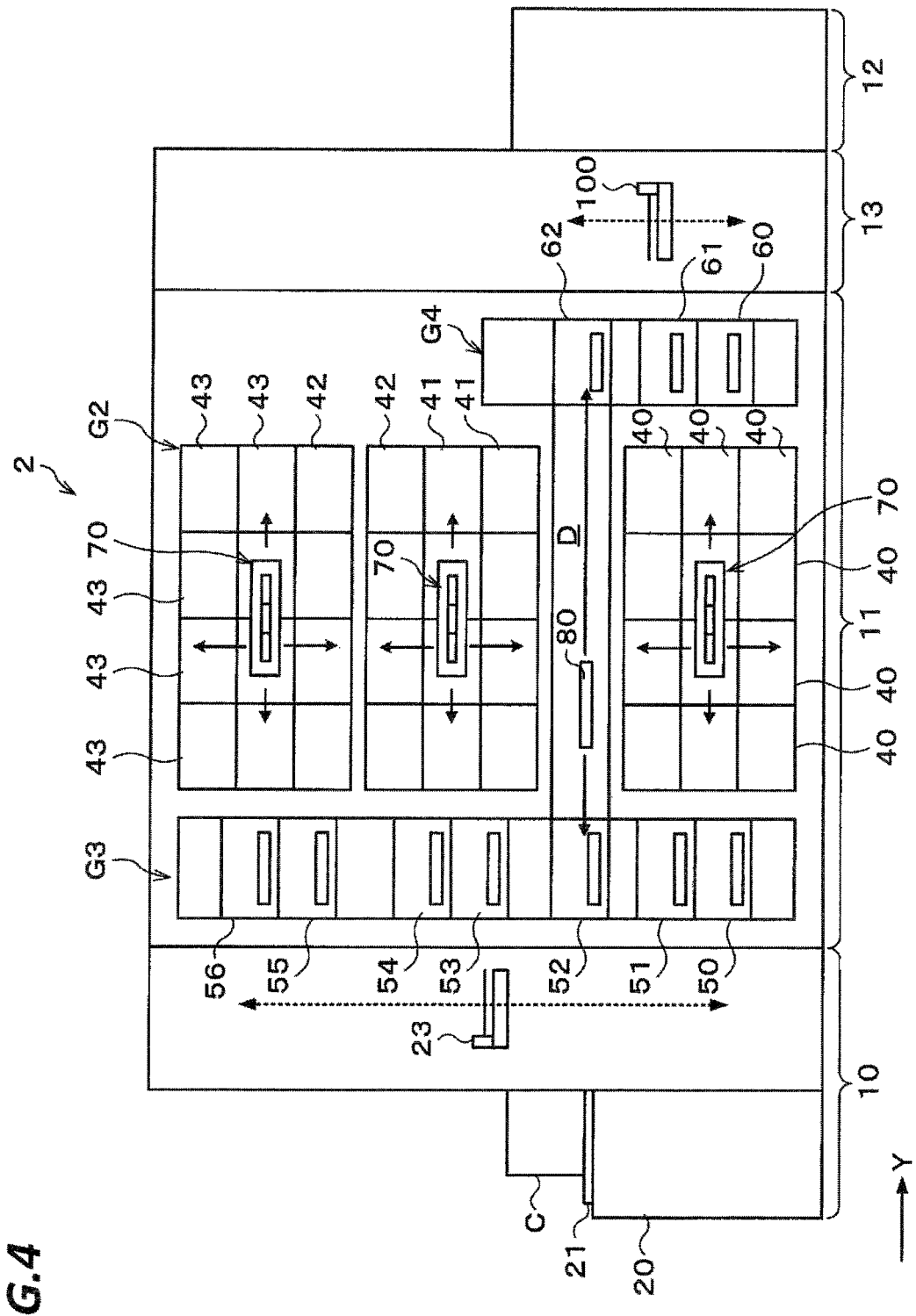
FIG. 4 is another side view illustrating the schematic internal configuration of the coating and developing apparatus.

For example, in the second block G2, as illustrated in FIG. 4, heat treatment apparatuses 40 which perform a heat treatment on each wafer W, adhesion apparatuses 41 which perform a hydrophobic treatment on the wafer W, periphery exposure apparatuses 42 which expose an outer periphery of the wafer W, and ultraviolet irradiation apparatuses 43 which function as energy ray irradiation apparatuses that irradiate the ultraviolet ray onto the wafer W as the energy ray, are provided side by side in the vertical and horizontal directions.

Each heat treatment apparatus 40 includes a heating plate on which a wafer W is disposed and heated and a cooling plate on which the wafer W is disposed and cooled down so that the heat treatment apparatus 40 may perform both the heating process and cooling process for the wafer W. The ultraviolet irradiation apparatus 43 includes a placing table on which the wafer W is disposed and a light source which irradiates the ultraviolet ray onto the wafer W disposed on the placing table, as the energy ray. The ultraviolet ray irradiated from the light source and used in order to cut the side chains of the resist pattern in the side chain cutting process has a wavelength which produces energy of, about 5 eV or more, more specifically, a wavelength of 184 nm or less. The side chain cutting process will be described below. The preferred wavelength is, for example, 172 nm to 184 nm, and in the present exemplary embodiment, for example, EUV light having a wavelength of 172 nm is irradiated. The energy of the EUV light having the wavelength of 172 nm is, for example, about 7 eV. In the meantime, the number or the arrangement of the heat treatment apparatus 40, the adhesion apparatus 41, the periphery exposure apparatus 42 and the ultraviolet irradiation apparatus 43 may be arbitrarily selected.

For example, in the third block G3, as illustrated in FIG. 2 and FIG. 3, a plurality of delivery apparatuses 50, 51, 52, 53, 54, 55, and 56 are provided sequentially from the bottom. Further, in the fourth block G4, a plurality of delivery apparatuses 60, 61, and 62 are provided sequentially from the bottom.

As illustrated in FIG. 2, a wafer conveyance region D is formed in a zone surrounded by the first block G1, the second block G2, the third block G3, and the fourth block G4. In the wafer conveyance region D, for example, a wafer conveyance apparatus 70 is disposed.

The wafer conveyance apparatus 70 includes a conveyance arm 71 which is movable in, for example, the Y direction, the X direction, the θ direction, and the vertical direction. The wafer conveyance apparatus 70 may move in the wafer conveyance region D to convey wafers W to a predetermined apparatus within the first block G1, the second block G2, the third block G3, and the fourth block G4 around the wafer conveyance apparatus 70.

A plurality of wafer conveyance apparatuses 70 may be disposed vertically, for example, as illustrated in FIG. 4 to convey the wafers W to, for example, the predetermined apparatuses of respective blocks G1, G2, G3, and G4 located at the same height.

Further, in the wafer conveyance region D, a shuttle conveyance apparatus 80 is provided to linearly convey the wafers W between the third block G3 and the fourth block G4.

The shuttle conveyance apparatus 80 is capable of linearly moving in, for example, the Y direction. The shuttle conveyance apparatus 80 may move in the Y direction to convey the wafer W supported thereon between the delivery apparatus 52 of the third block G3 and the delivery apparatus 62 of the fourth block G4.

As illustrated in FIG. 2, a wafer conveyance apparatus 90 is provided at a site adjacent to the positive X direction side of the third block G3. The wafer conveyance apparatus 90 includes a conveyance arm which is movable in, for example, the Y direction, the X direction, the θ direction, and the vertical direction. The wafer conveyance apparatus 90 may move in the vertical direction to convey the wafer W supported thereon to the respective delivery apparatuses within the third block G3.

A wafer conveyance apparatus 100 and a delivery apparatus 101 are provided in the interface station 13. The wafer conveyance apparatus 100 includes a conveyance arm which is movable in, for example, the Y direction, the X direction, and the vertical direction. The wafer conveyance apparatus 100 may support a wafer W by, for example, the conveyance arm to convey the wafer W among respective delivery apparatuses within the fourth block G4, and the delivery apparatus 101, and the exposure apparatus 12.

Figure 5:
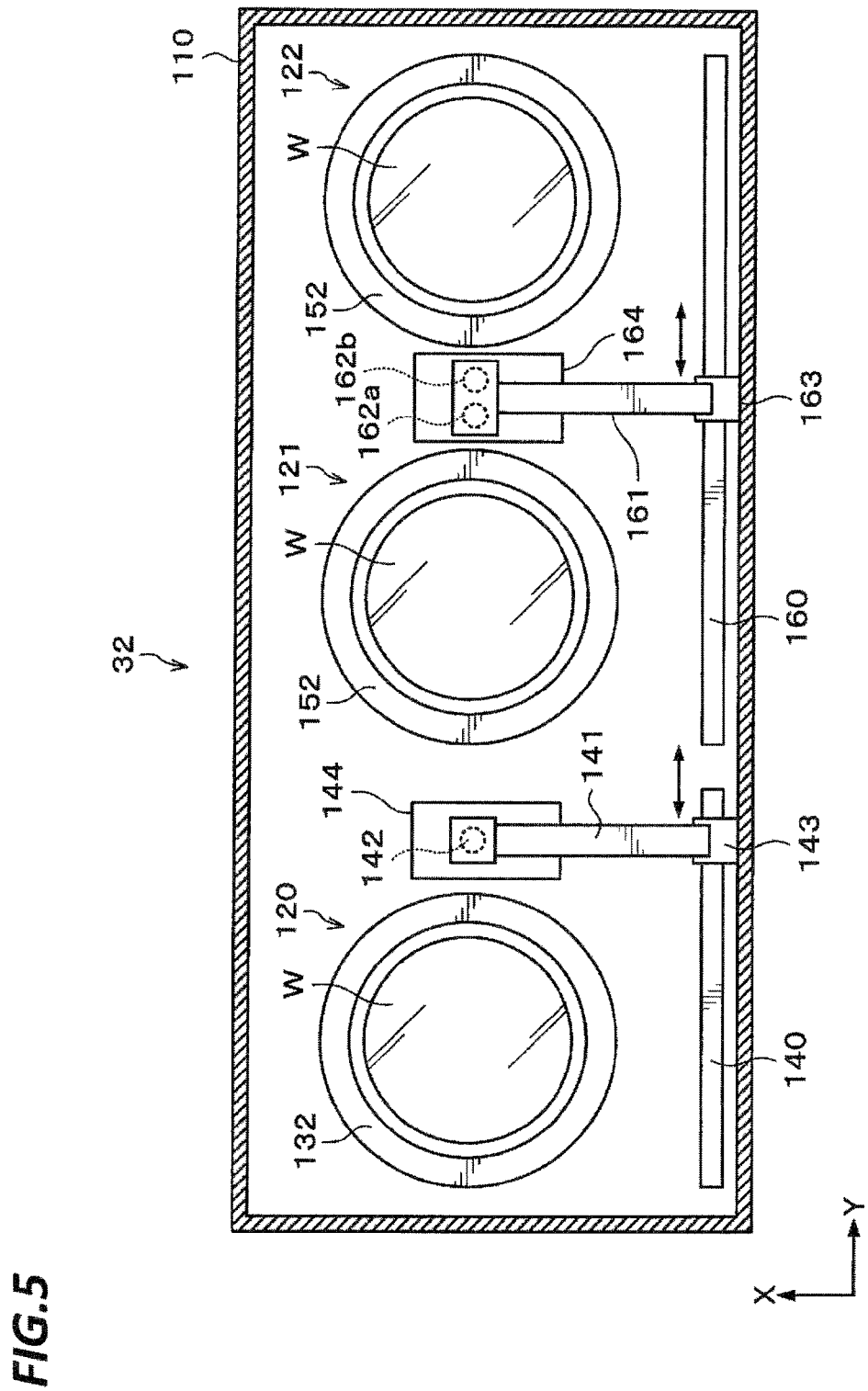
FIG. 5 is a horizontal cross-sectional view illustrating a schematic configuration of a coating apparatus.

Next, descriptions will be made on a configuration of the coating apparatus 32 described above. The coating apparatus 32 includes a processing container 110 of which the inside is closable as illustrated in FIG. 5. On the side surface of the wafer conveyance region D side of the processing container 110 carry-in/carry-out ports (not illustrated) of the wafer W are formed, for example, at three locations and opening/closing shutters (not illustrated) are provided in the carry-in/carry-out ports, respectively. Further, these three carry-in/carry-out ports are formed to correspond in position to a metal processing unit 120, a cleaning processing unit 121, and a resist film forming unit 122, respectively. In the meantime, the metal processing unit 120 serves as the metal processing apparatus in the present disclosure.

The metal processing unit 120, the cleaning processing unit 121, and the resin film forming unit 122 are provided inside the processing container 110, for example, as will be described later, in which the metal processing unit 120 allows an organic metal compound (e.g., metal alkoxide) composed by using, for example, alkoxide to enter the resist pattern on the wafer W as a processing agent and causes a metal to be infiltrated into the resist pattern through a solvent such as, for example, alcohol which constitutes the alkoxide, the cleaning processing unit 121 supplies the cleaning liquid onto the wafer W supplied with the processing agent to wash out the processing agent, and the resist film forming unit 122 forms the resist film on the wafer W. The metal processing unit 120, the cleaning processing unit 121, and the resist film forming unit 122 are arranged side by side in this order in the direction from the negative Y direction (the left direction of FIG. 5) side to the positive Y direction (the right direction of FIG. 5) side.

Figure 6:
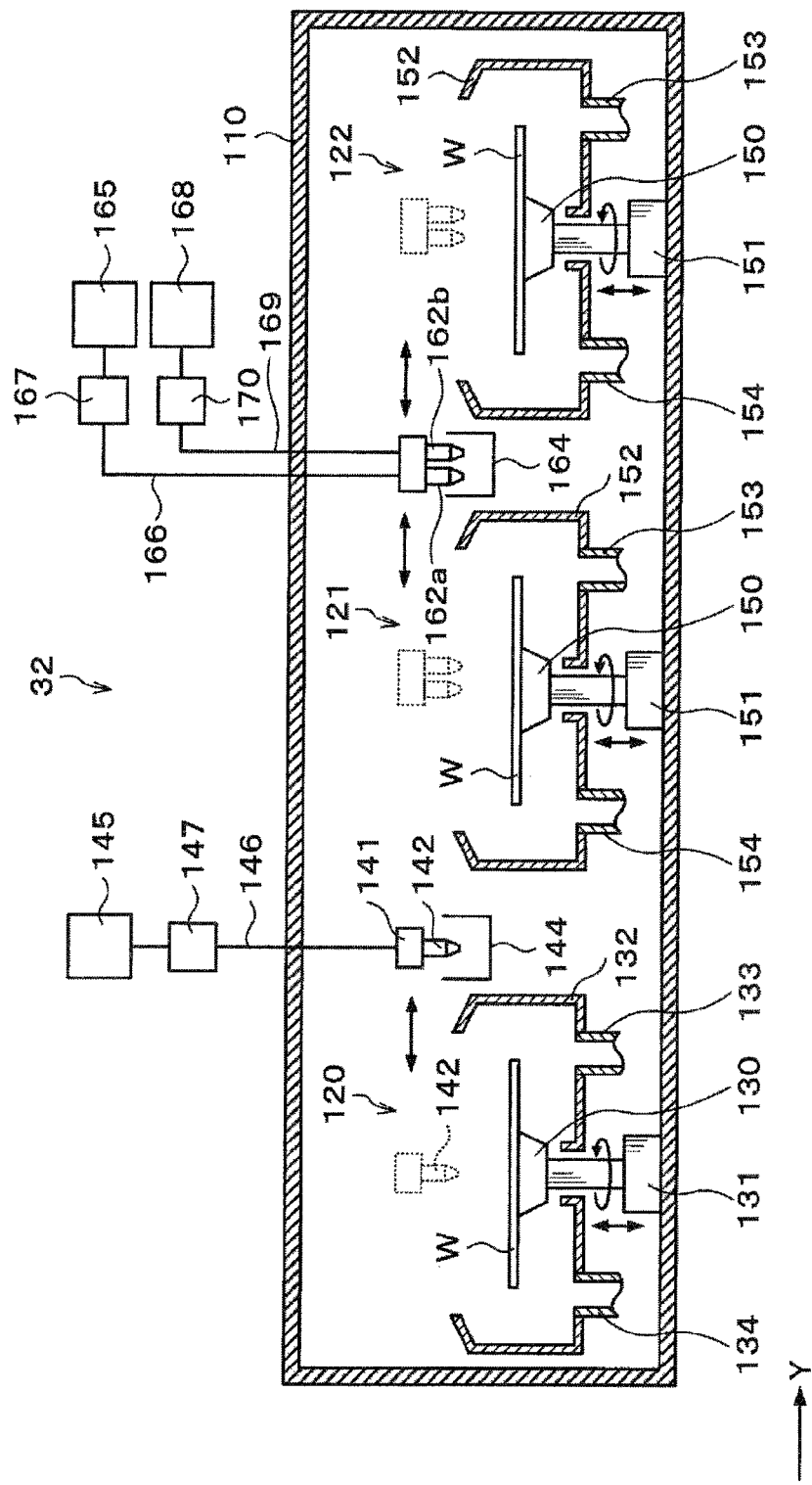
FIG. 6 is a vertical cross-sectional view illustrating a schematic configuration of the coating apparatus.

A spin chuck 130 is provided in the metal processing unit 120 to hold and rotate a wafer W, as illustrated in FIG. 6. The spin chuck 130 has a horizontal top surface and, for example, a suction port (not illustrated) sucking the wafer W is formed in the top surface. The wafer W may be attracted to and held on the spin chuck 130 due to suction from the suction port.

A chuck driving unit 131, which is provided with, for example, a motor, is provided below the spin chuck 130. The spin chuck 130 may be rotated at a predetermined speed by the chuck driving unit 131. Further, the chuck driving unit 131 is provided with, for example, an elevating drive source, for example, a cylinder and the spin chuck 130 is configured to be movable up and down.

A cup 132 is provided around the spin chuck 130 to receive and recover the liquid scattered or dropped from the wafer W. A discharge pipe 133 and an exhaust pipe 134 are connected to the bottom of the cup 132 to discharge the recovered liquid and to exhaust the atmosphere inside the cup 132, respectively.

As illustrated in FIG. 5, a rail 140 extending along the Y direction (right and left direction in FIG. 5) is formed at the negative X direction side of the cup 132 (downward direction in FIG. 5). The rail 140 is formed to extend, for example, from the outside of the negative Y direction (left direction in FIG. 5) side of the cup 132 to the outside of the positive Y direction (right direction in FIG. 5) side of the cup 132. An arm 141 is attached to the rail 140.

As illustrated in FIGS. 5 and 6, a processing liquid nozzle 142 functioning as a processing agent supplying part is supported on the arm 141 to supply the processing liquid which is in a liquid state as the processing agent onto the wafer W. The arm 141 is movable on the rail 140 by a nozzle driving unit 143a illustrated in FIG. 5. Accordingly, the processing liquid nozzle 142 may move from a standby section 144 provided at the outside of the positive Y direction side of the cup 132 to a position above the central part of the wafer W within the cup 132, and further, move above the wafer W in the diametrical direction of the wafer W. Further, the arm 141 may be moved up and down by the nozzle driving unit 143 to adjust the height of the processing liquid nozzle 142.

As illustrated in FIG. 6, a supply pipe 146 communicated with a processing liquid supply source 145 is connected to the processing liquid nozzle 142. The metal alkoxide solution as the processing liquid is stored in the processing liquid supply source 145. A supply equipment group 147 including, for example, a valve or a flow rate adjusting unit that controls the flow rate of the processing liquid, is provided in the supply pipe 146. For example, Ti (titanium), Zr (zirconium) or W (tungsten) is used as a metal to be contained in the metal alkoxide. In the meantime, the metal is nanoparticle having a fine diameter of, for example, 5 nm or less.

A spin chuck 150 is provided in the cleaning processing unit 121 to hold and rotate a wafer W, as illustrated in FIG. 6. The spin chuck 150 has the horizontal top surface and, for example, a suction port (not illustrated) sucking the wafer W is formed on the top surface. The wafer W may be attracted to and held on the spin chuck 150 due to suction by the suction port.

For example, a chuck driving unit 151 provided with, for example, a motor, is provided below the spin chuck 150. The spin chuck 150 may be rotated at a predetermined speed by the chuck driving unit 151. Further, the chuck driving unit 151 is provided with, for example, an elevating drive source such as, for example, a cylinder, and the spin chuck 150 is configured to be movable up and down.

A cup 152 is provided around the spin chuck 150 to receive and recover the liquid scattered or dropped from the wafer W. A discharge pipe 153 and an exhaust pipe 154 are connected to the bottom surface of the cup 152 to discharge the recovered liquid and to exhaust the atmosphere inside the cup 132, respectively.

In the meantime, the spin chuck 150, the chuck driving unit 151, the cup 152, the discharge pipe 153, and the exhaust pipe 154 are provided also in the resist film forming unit 122, similarly as in the cleaning processing unit 121.

As illustrated in FIG. 5, the rail 160 extending along the Y direction (horizontal direction in FIG. 5) is formed at the negative X direction (downward direction in FIG. 5) side of the cup 152 of the cleaning processing unit 121 and the resist film forming unit 122. The rail 160 is formed to extend, for example, from the outside of the negative Y direction (left direction in FIG. 5) side of the cup 152 of the cleaning processing unit 121 to the outside of the positive Y direction (right direction in FIG. 5) side of the cup 152 of the resist film forming unit 122. An arm 161 is attached to the rail 160.

As illustrated in FIGS. 5 and 6, a cleaning liquid nozzle 162a and a resist liquid nozzle 162b to the wafer W are supported on the arm 161 to supply a cleaning liquid to the wafer W and to supply a resist liquid to the wafer W, respectively. The arm 161 is movable on the rail 160 by a nozzle driving unit 163 illustrated in FIG. 5. Accordingly, the cleaning liquid nozzle 162a and the resist liquid nozzle 162b may move from a standby section 164 provided between the cup 152 of the cleaning processing unit 121 and the cup 152 of the resist film forming unit 122 to a position above the central part of the wafer W within the cup 152, and further, move to a position above the wafer W in the diametrical direction of the wafer W. Further, the arm 161 may be moved up and down by the nozzle driving unit 163 and may adjust the heights of the cleaning liquid nozzle 162a and the resist liquid nozzle 162b.

As illustrated in FIG. 6, a supply pipe 166 communicated with the processing liquid supply source 165 is connected to the cleaning liquid nozzle 162a. The cleaning liquid is stored in the cleaning liquid supply source 165. A supply equipment group 167 including, for example, a valve or a flow rate adjusting unit that controls the flow rate of the processing liquid, is provided in the supply pipe 166. In the meantime, a cleaning liquid having a high solubility to the processing liquid supplied from the processing liquid nozzle 142 is used from a viewpoint of washing out the processing liquid. In the present exemplary embodiment, for example, deionized water is used as the cleaning liquid, but a type of the cleaning liquid to be used is not limited to the content of the present exemplary embodiment and may be appropriately selected according to the processing liquid.

As illustrated in FIG. 6, a supply pipe 169 communicated with the resist liquid supply source 168 is connected to the resist liquid nozzle 162. The resist liquid is stored in the resist liquid supply source 168. A supply equipment group 170 including, for example, a valve or a flow rate adjusting unit that controls the flow of the processing liquid, is provided in the supply pipe 169.

Figure 7:
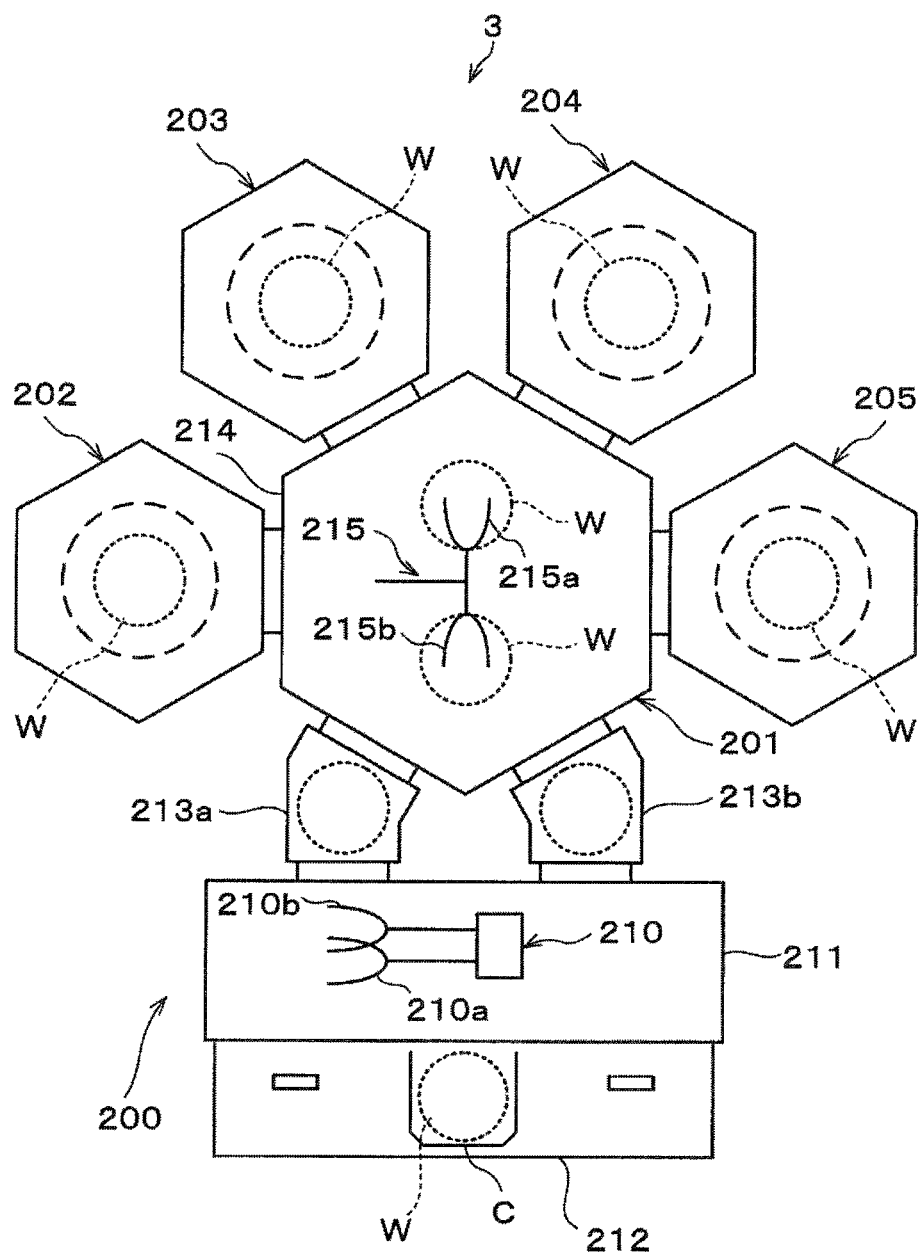
FIG. 7 is a plane view illustrating a schematic configuration of an etching apparatus.

Next, descriptions will be made on the configuration of the etching apparatus 3 described above. As illustrated in FIG. 7, the etching apparatus 3 includes a cassette station 200 in which carry-in/carry-out wafers W is performed with respect to the etching apparatus 3, a common conveyance unit 201 which conveys the wafers W, and etching apparatuses 202, 203, 204, and 205 which etch the lower anti-reflection films and the processing target films in a predetermined pattern using the resist patterns on the wafers W as masks.

The cassette station 200 includes a conveyance chamber 211 in which the wafer conveyance mechanism 210 is provided to convey the wafers W. The wafer conveyance mechanism 210 includes two conveyance arms 210a and 210b that hold the wafers W substantially horizontally, and has a configuration in which a wafer W is conveyed while being held by one of the conveyance arms 210a and 210b. At a side of the conveyance chamber 211, a cassette placing table 212 is provided to dispose thereon a cassette C capable of accommodating a plurality of wafers W in parallel. In the illustrated example, a plurality of cassettes C, for example, three cassettes C may be disposed on the cassette placing table 212.

The conveyance chamber 211 and the common conveyance unit 201 are connected with each other through two load-lock apparatuses 213a and 213b that may be evacuated.

The common conveyance unit 201 includes a conveyance chamber 214 having a closable structure formed to have a substantially polygon shape (hexagonal shape in the illustrated example), for example, when viewed from the top side. A wafer conveyance mechanism 215 is provided within the conveyance chamber 214 to convey the wafers W. The wafer conveyance mechanism 215 includes two conveyance arms 215a and 215b that hold the wafers W substantially horizontally, and has a configuration in which a wafer W is conveyed while being held by one of the conveyance arms 215a and 215b.

At the outside of the conveyance chamber 214, the etching apparatuses 202, 203, 204, and 205, and the load-lock apparatuses 213b and 213a are disposed to surround the periphery of the conveyance chamber 214. The etching apparatuses 202, 203, 204, and 205, and the load-lock apparatuses 213b and 213a are disposed side by side in this order in a clockwise direction when viewed from the top side, for example, and further, disposed to face six side portions of the conveyance chamber 214, respectively.

In the meantime, for example, a reactive ion etching (RIE) apparatus is used for each of the etching apparatuses 202, 203, 204, and 205. That is, the etching apparatuses 202, 203, 204, and 205 perform dry etching to etch the lower anti-reflection film or the processing target film using a reactive gas (etching gas), ions, or radicals.

The substrate processing system 1 as described above is provided with a control device 300, as illustrated in FIG. 1. The control device 300 is, for example, a computer, and includes a program storing unit (not illustrated). A program which controls processings for wafers W in the substrate processing system 1 is stored in the program storing unit. In the meantime, the program may be a program which has been stored in from a computer-readable storage medium such as, for example, a hard disk (HD), a flexible disk (FD), a compact disk (CD), a magnetic-optical disk (MO), or a memory card, and is installed onto the control device 300 from the computer-readable storage medium.

Figure 8:
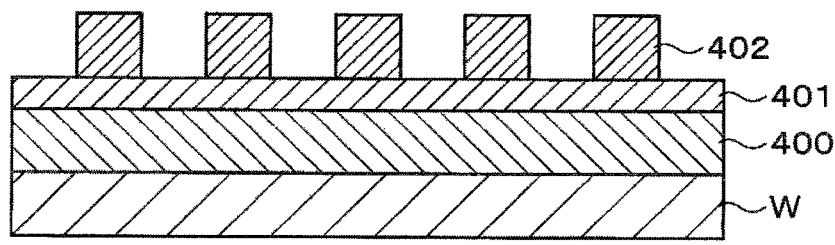
FIG. 8 is an explanatory view illustrating a situation where a resist pattern is formed on a wafer.

Next, descriptions will be made on a wafer W processing method using the substrate processing system 1 having the configuration as described above. FIG. 8 schematically illustrates a state of a wafer W in each process of the wafer processing. In the meantime, as illustrated in FIG. 8, a processing target film 400 is formed in advance on the wafer W which will be processed in the substrate processing system 1.

First, a cassette C which accommodates a plurality of wafers W is carried into the cassette station 10 of the coating and developing apparatus 2 and disposed on a predetermined cassette placement plate 21. Then, each wafer W within the cassette C is sequentially taken out by the wafer conveyance apparatus 23 and conveyed to the delivery apparatus 53 of the processing station 11.

Subsequently, the wafer W is conveyed to the heat treatment apparatus 40 by the wafer conveyance apparatus 70 and subjected to temperature adjustment. Thereafter, the wafer W is conveyed to the lower anti-reflection film forming apparatus 31 by the wafer conveyance apparatus 70 and the lower anti-reflection film 401 is formed on the processing target film 400 of the wafer W as illustrated in FIG. 8. The wafer W is conveyed to and heated in the heat treatment apparatus 40, and is returned to the delivery apparatus 53 after having been subjected to the temperature adjustment.

Next, the wafer W is conveyed to the delivery apparatus 54 by the wafer conveyance apparatus 90. Thereafter, the wafer W is conveyed to the adhesion apparatus 41 by the wafer conveyance apparatus 70 and subjected to an adhesion processing. The wafer W is conveyed to the heat treatment apparatus 40 by the wafer conveyance apparatus 70 and subjected to the temperature adjustment. Next, the wafer W is conveyed to a resist film forming unit 122 of the coating apparatus 32 by the wafer conveyance apparatus 70.

The wafer W conveyed to the resist film forming unit 122 is attracted to and held on the spin chuck 150. Subsequently, a resist liquid nozzle 162b of the standby section 164 is moved to a position above the central portion of the wafer W by the arm 161. Thereafter, the resist liquid is supplied onto the central portion of the wafer W from the resist liquid nozzle 162b while the wafer W is rotated by the spin chuck 150. The resist liquid supplied onto the wafer W is diffused over the entire surface of the wafer W due to the centrifugal force generated by rotation of the wafer W. In this manner, the resist liquid is applied onto the wafer W to form a resist film on the wafer W.

Subsequently, the wafer W is conveyed to the heat treatment apparatus 40 by the wafer conveyance apparatus 70 and subjected to a prebake processing. Thereafter, the wafer W is conveyed to the delivery apparatus 55 by the wafer conveyance apparatus 70.

Subsequently, the wafer W is conveyed to the upper anti-reflection film forming apparatus 33 by the wafer conveyance apparatus 70 and an upper anti-reflection film (not illustrated) is formed on the wafer W. Thereafter, the wafer W is conveyed to the heat treatment apparatus 40 by the wafer conveyance apparatus 70, heated, and subjected to the temperature adjustment. Thereafter, the wafer W is conveyed to the periphery exposure apparatus 42 by the wafer conveyance apparatus 70 and a periphery exposure processing is performed on the periphery of the resist film on the wafer W.

Thereafter, the wafer W is conveyed to the delivery apparatus 56 by the wafer conveyance apparatus 70. Thereafter, the wafer W is conveyed to the delivery apparatus 52 by the wafer conveyance apparatus 90 and to the delivery apparatus 62 by the shuttle conveyance apparatus 80.

Subsequently, the wafer W is conveyed to the exposure apparatus 12 by the wafer conveyance apparatus 100 of the interface station 13. In the exposure apparatus 12, light is irradiated on the resist film on the wafer W and the resist film is selectively exposed to a predetermined pattern.

Thereafter, the wafer W is conveyed from the exposure apparatus 12 to the delivery apparatus 60 by the wafer conveyance apparatus 100. Thereafter, the wafer W is conveyed to the heat treatment apparatus 40 by the wafer conveyance apparatus 70 and subjected to a post-exposure bake processing.

Figure 9:
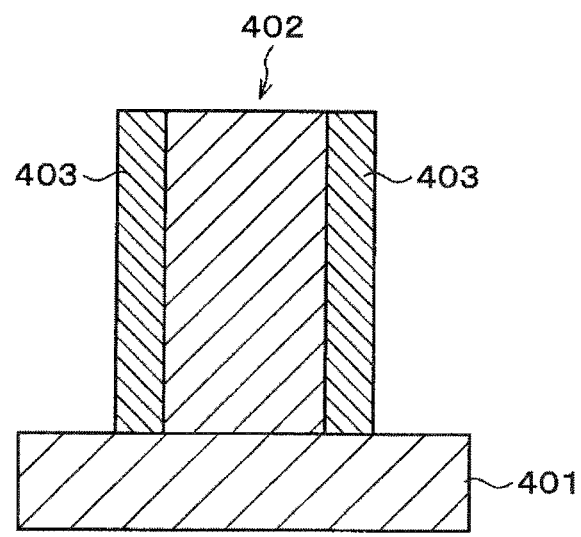
FIG. 9 is an explanatory view illustrating a situation where an unevenness part is formed on a side surface of the resist pattern.

Subsequently, the wafer W is conveyed to the developing apparatus 30 by the wafer conveyance apparatus 70. In the developing apparatus 30, the developer is supplied onto the resist film on the wafer W to be subjected to a development process such that a resist pattern 402 is formed on the wafer W as illustrated in FIG. 8. In this case, as illustrated in FIG. 9, fine uneven portions 403 called line edge roughness are generated on both side surfaces of the resist pattern 402.

Subsequently, the wafer W is conveyed to the heat treatment apparatus 40 by the wafer conveyance apparatus 70 and subjected to the post-exposure bake processing. Thereafter, the wafer W is conveyed to the ultraviolet irradiation apparatus 43 by the wafer conveyance apparatus 70. In the ultraviolet irradiation apparatus 43, the ultraviolet ray is irradiated onto the wafer W to heat the resist pattern 402 of the wafer W and the side chains of the resist pattern 402 is cut by energy of the ultraviolet ray. The surface of the uneven portion 403 of the resist pattern 402 is smoothly uniformized by the ultraviolet irradiation and thus, the resist pattern 402 without an uneven portion is formed.

Subsequently, the wafer W is conveyed to the delivery apparatus 54 by the wafer conveyance apparatus 90. Thereafter, the wafer W is conveyed to the metal processing unit 120 of the coating apparatus 32 by the wafer conveyance apparatus 70.

The wafer W conveyed to the metal processing unit 120 is attracted to and held on the spin chuck 130. Subsequently, the processing liquid nozzle 142 of the standby section 144 is moved to a position above the central portion of the wafer W by the arm 141. Thereafter, a processing liquid is supplied onto the central portion of the wafer W from the processing liquid nozzle 142 while the wafer W is rotated by the spin chuck 130. The processing liquid supplied onto the wafer W is diffused over the entire surface of the wafer W due to the centrifugal force generated by rotation of the wafer W.

As described above, when the processing liquid is applied onto the wafer W, the processing liquid enters the inside of the resist pattern 402. Also, the metal contained in the metal alkoxide as the processing liquid which has entered the resist pattern 402 is combined with the side chains of the resist pattern 402 which is cut by the ultraviolet irradiation in the ultraviolet irradiation apparatus 43, and the metal 404 is infiltrated into the resist pattern 402.

Subsequently, the wafer W is conveyed to the cleaning processing unit 121 and attracted to and held on the spin chuck 150. Subsequently, the cleaning liquid nozzle 162a of the standby section 164 is moved to a position above the central portion of the wafer W by the arm 161. Thereafter, deionized water as the cleaning liquid is supplied from the cleaning liquid nozzle 162a to the central portion of the wafer W while the wafer W is rotated by the spin chuck 150. Accordingly, the processing liquid on the wafer W is washed out by the cleaning liquid.

Figure 11:
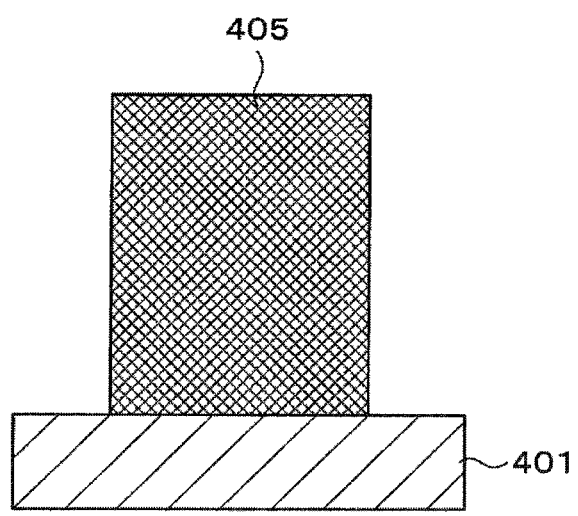
FIG. 11 is an explanatory view illustrating a situation where a cured resist pattern is formed through a heat treatment of the resist pattern.

Subsequently, the wafer W is conveyed to the heat treatment apparatus 40 by the wafer conveyance apparatus 70 and is subjected to the heat treatment at a predetermined temperature. The alcohol component constituting the metal alkoxide which has entered the resist pattern 402 is evaporated and only the metal remains in the resist pattern 402. Accordingly, as illustrated in FIG. 11, a cured resist pattern 405 of which is wholly cured by the infiltrated metal is formed. The cured resist pattern 405 has a high etching resistance due to the infiltrated metal. Therefore, the cured resist pattern 405 has a high etching selection ratio with respect to the lower anti-reflection film 401 and the processing target film 400.

Thereafter, the wafer W is conveyed to the delivery apparatus 54 by the wafer conveyance apparatus 70 and then, to the cassette C of the predetermined cassette placement plate 21 by the wafer conveyance apparatus 23 of the cassette station 10.

When a predetermined processing is performed on the wafer W in the coating and developing apparatus 2, the cassette C accommodating the wafer W is carried out from the coating and developing apparatus 2 and subsequently, carried into the etching apparatus 3.

In the etching apparatus 3, a single wafer W is taken out from the cassette C on the cassette placing table 212 by the wafer conveyance mechanism 210 and carried into the load-lock apparatus 213a. When the wafer W is carried into the load-lock apparatus 213a, the inside of the load-lock apparatus 213a is hermetically sealed and depressurized. Thereafter, the inside of the load-lock apparatus 213a is communicated with the inside of the conveyance chamber 214 which is in a depressurized state (e.g., approximately vacuum state) with respect to an atmospheric pressure. Also, the wafer W is carried out from the load-lock apparatus 213a and carried into the conveyance chamber 214 by the wafer conveyance mechanism 215.

Figure 12:
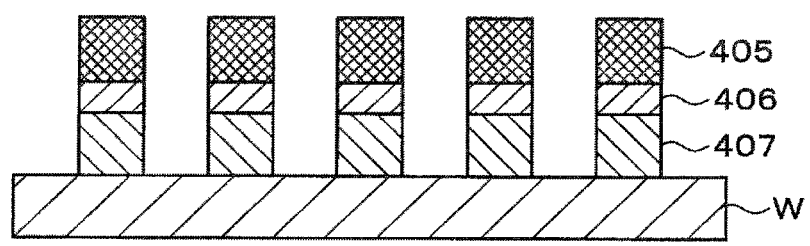
FIG. 12 is an explanatory view illustrating a situation where a predetermined pattern is formed on a processing target film.

The wafer W carried into the conveyance chamber 214 is subsequently conveyed to, for example, the etching apparatus 202 by the wafer conveyance mechanism 215. In the etching apparatus 202, the lower anti-reflection film 401 and the processing target film 400 on the wafer W are respectively etched using the cured resist pattern 405 on the wafer W as the mask by using, for example, $O_2$ gas ($O_2$ plasma) or CF gas (CF plasma). In this case, since the cured resist pattern 405 has a high etching selection ratio to the lower anti-reflection film 401 and the processing target film 400, a predetermined pattern 406 is formed on the lower anti-reflection film 401 in a suitable shape and a predetermined pattern 407 is formed on the processing target film in a suitable shape as illustrated in FIG. 12.

Thereafter, the wafer W is returned into the conveyance chamber 214 by the wafer conveyance mechanism 215 again. Also, the wafer W is delivered to the wafer conveyance mechanism 210 through the load-lock apparatus 213b and accommodated in the cassette C. Thereafter, the cassette C which has accommodated the wafer W is carried out from the etching apparatus 3 and a series of processings for the wafer are finished.

According to the exemplary embodiment described above, first, the ultraviolet ray is irradiated to heat the resist pattern 402 on the wafer W, the uneven portion 403 on the side surface of the wafer W is uniformized and the side surface of the resist pattern 402 is flattened. That is, the line edge roughness of the resist pattern 402 is improved. Subsequently, the metal alkoxide is allowed to enter the resist pattern 402 as the processing liquid and the metal 404 is allowed to enter the resist pattern 402 by using the processing agent as an entering pathway. In this case, the side chains of the resist pattern 402 which are cut by the energy of the ultraviolet ray at the time of irradiating the ultraviolet ray is bonded to the metal 404 which has entered inside of the resist pattern 402 to form the cured resist pattern 405 having the high etching resistance. Accordingly, a high etching selection ratio may be obtained when the etching processing is performed on the processing target film 400 using the cured resist pattern 405 as the mask, and thus, a pattern having, for example, a high aspect ratio may be formed on the processing target film 400. In this case, since the uneven portion 403 on the side surface of the wafer W is uniformized, the pattern having a good pattern shape may be formed without causing the uneven portion 403 to be transferred onto the processing target film 400.

Further, since the cured resist pattern 405 has a high etching selection ratio with respect to the processing target film 400 on the wafer, even when the height of the cured resist pattern 405 is low (i.e., even when the film thickness of the resist film is thin), the cured resist pattern 405 sufficiently functions as the mask at the time when the processing target film 400 is etched in the etching apparatus. Therefore, since an aspect ratio of the resist pattern 402 may be made smaller, the so-called pattern collapse may be avoided. Therefore, a desired pattern may be suitably formed on the wafer W.

Conventionally, an SOC (Spin On Carbon) film and a SiARC (Silicon-containing Anti-Reflective Coating) film may be stacked on the processing target film 400 in this order from the processing target film 400 side to enhance the etching resistance. In contrast, in the present exemplary embodiment, since the etching resistance of the cured resist pattern 405 itself is high, it is only required that the lower anti-reflection film 401 is formed on the processing target film 400. Therefore, the throughput of the wafer processing may be enhanced and the manufacturing cost of a product may be lowered.

In the exemplary embodiment described above, the infiltration amount of the metal 404 infiltrated into the resist pattern 402, that is, a concentration of the metal 404 in the resist pattern 402 is controlled by adjusting, for example, any one or all of the following four parameters.

As a first parameter, for example, an infiltration time of the metal 404 in the metal processing unit 120 of the coating apparatus 32 may be considered. When the time for supplying a metal-containing liquid from the processing liquid nozzle 142 is increased, the time for causing the metal 404 to be infiltrated into the resist pattern 402 may be increased and thus, the infiltration amount of the metal 404 may be increased. In the meantime, when the infiltration time of the metal 404 is shortened, the infiltration amount of the metal 404 may be reduced.

As a second parameter, for example, the temperature of the processing liquid 120 supplied from the metal processing apparatus 120 of the coating apparatus 32 may be considered. When the temperature of the processing liquid supplied from the processing liquid nozzle 142 is raised, the infiltration of the metal 404 into the resist pattern 402 is facilitated and thus, the infiltration amount of the metal 404 may be increased. In the meantime, when the temperature of the processing liquid is reduced, the infiltration amount of the metal 404 may be reduced.

As a third parameter, for example, the amount of solvent in the resist pattern 402 processed in the metal processing unit 120 of the coating apparatus 32 may be considered. The amount of the solvent may be adjusted by using various methods.

For example, when the heat treatment (prebake processing) is performed in the heat treatment apparatus 40 after the resist film is formed on the wafer W in the resist film forming unit 122 of the coating apparatus 32, the temperature or time for the heat treatment may be adjusted to adjust the amount of the solvent in the resist film, that is, the amount of the solvent in the resist pattern 402. When the heat treatment temperature is reduced or the heat treatment time is shortened, the amount of the solvent in the resist pattern 402 may be increased. In this case, the amount of the processing liquid which enters the resist pattern 402 may be increased and further, the amount of the metal 404 infiltrated into the resist pattern 402 may be increased. In the meantime, when the heat treatment temperature is raised or the heat treatment time is increased, the amount of the solvent in the resist pattern 402 may be reduced. In this case, the amount of the processing liquid which enters the resist pattern 402 may be reduced and thus, the amount of the metal 404 infiltrated into the resist pattern 402 may be reduced.

Further, for example, the solvent may be supplied on the resist film from a separately provided solvent supply apparatus (not illustrated) to actively increase the amount of the solvent in the resist film. Further, for example, a material of the resist liquid supplied form the resist liquid nozzle 162b of the resist film forming unit 122 may be changed to adjust the amount of the solvent in the resist film.

As a fourth parameter, for example, the irradiation amount of the ultraviolet ray in the ultraviolet irradiation apparatus 43, that is, the irradiation strength and time of the ultraviolet ray may be considered. When the irradiation amount is increased, more side chains of the resist pattern 402 are cut. Also, since the metal 404 in the processing liquid which has entered the resist pattern 402 is bonded to the cut side chains to be infiltrated into the resist pattern 402, the amount of the cut side chains may be adjusted such that the amount of the metal 404 infiltrated into the resist pattern 402 may be controlled.

In the meantime, when the irradiation amount of the ultraviolet ray is made larger, both the side chains and the main chains of the resist pattern 402 are cut. When the main chains are cut, expansion of the resist pattern 402 in a width direction, which is so-called reflow, occurs and thus, the irradiation amount of the ultraviolet ray may be adjusted such that only the side chains of the resist pattern 402 are cut, from a viewpoint of maintaining the shape of the resist pattern 402 in a desirable state.

In this manner, the infiltration amount of the metal 404 infiltrated into the resist pattern 402 may be controlled. Further, the infiltration amount of the metal 404 infiltrated into the resist pattern 402 may be adjusted according to an etching selection ratio required for the etching processing in the etching apparatuses 202, 203, 204, and 205. Accordingly, the etching processing may be more suitably performed.

In the exemplary embodiment described above, the ultraviolet ray is irradiated when the resist pattern 402 is heated to uniformize the uneven portion 403. However, for example electron beam may be utilized instead of the ultraviolet ray, as long as energy may be applied to the resist pattern 402 to cut the side chains of the resist pattern 402 while heating the resist pattern 402. Even when the electron beam is utilized, the infiltration amount of the electron beam may be suitably adjusted to control the amount of the metal 404 infiltrated into the resist pattern 402.

In the exemplary embodiment described above, the metal alkoxide is used as the processing agent, but the material other than the metal alkoxide may be used as the processing agent as long as the material is capable of entering the resist pattern 402 to cause the metal to be infiltrated into the resist pattern 402. As the processing agent other than the metal alkoxide, for example, the metal acylate or the metal chelate may be used. In the meantime, as to whether to use any one of the metal alkoxide, the metal acylate, and the metal chelate as the processing agent, determination may be suitably made according to a type of the metal infiltrated into the resist pattern 402 and the composition of the resist pattern 402 itself. That is, since the easiness of entry of the processing agent into resist pattern 402 is changed according to, for example, solubility of the processing agent to the resist pattern 402, the processing agent may be suitably selected according to the amount of the metal infiltrated into the resist pattern 402. In the meantime, as for example, titanium, zirconium, or tungsten may be considered as the metal infiltrated into the resist pattern 402.

In the meantime, when the ultraviolet ray is irradiated onto the resist pattern 402, the ultraviolet ray may be irradiated within an oxygen atmosphere. When the ultraviolet ray is irradiated within the oxygen atmosphere, oxygen generates active oxygen (oxygen radicals) by the ultraviolet ray. In this case, the resist and the active oxygen are reacted with each other and the resist is dissolved in the uneven portion 403 of the side surface of the resist pattern 402, and the uneven portion 403 is more uniformly flattened.

In the exemplary embodiment described above, the metal processing unit 120 of the coating apparatus 32 supplies the metal alkoxide onto the wafer W as the processing agent at the time when the metal 404 enters the resist pattern 402. However, for example, alcohol may be supplied onto the wafer W first as the processing agent, and thereafter, the metal-containing liquid containing the metal 404 may be supplied onto the wafer W.

Figure 13:
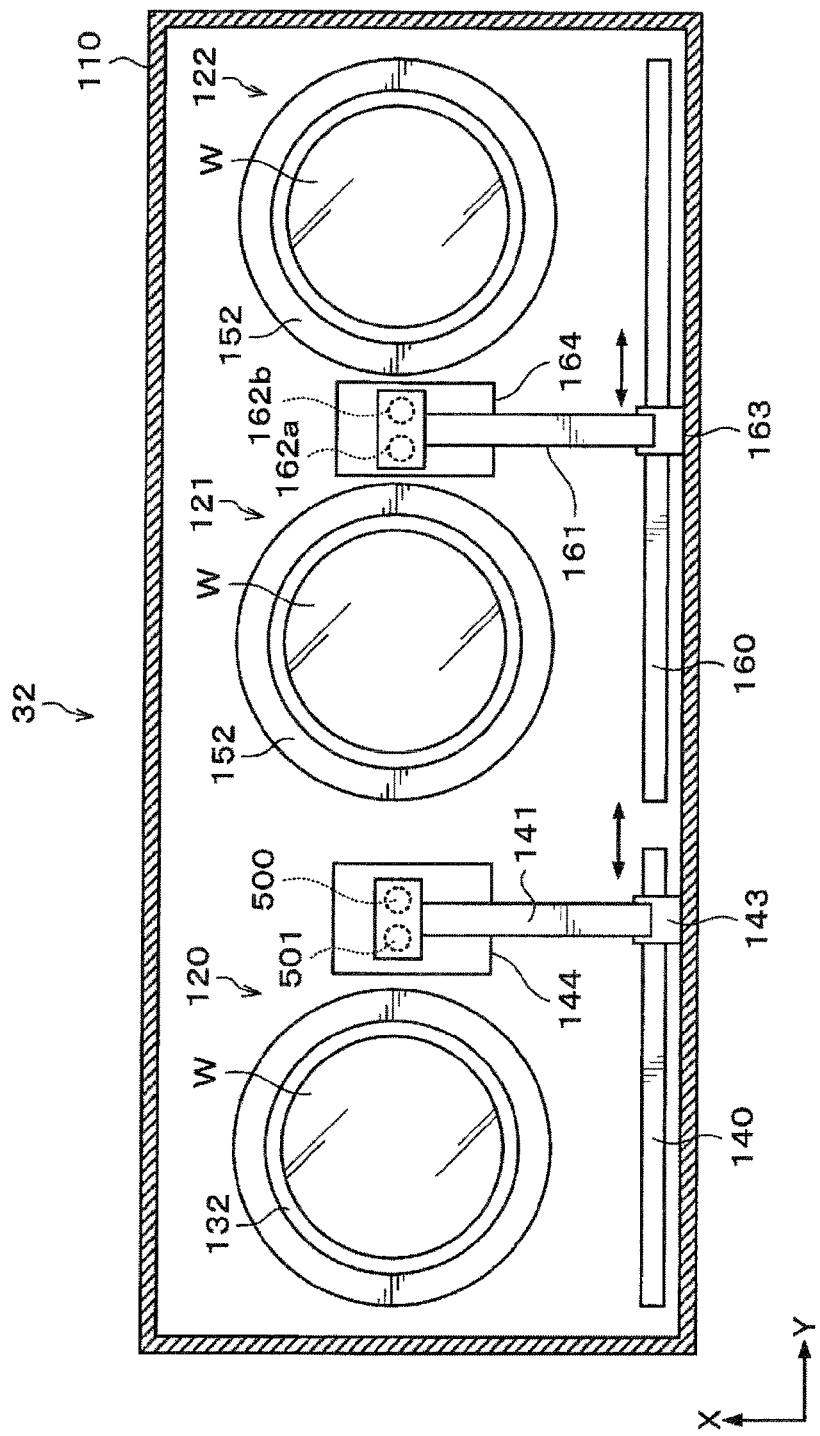
FIG. 13 is a horizontal cross-sectional view illustrating a schematic configuration of a coating apparatus according to another exemplary embodiment.
Figure 14:
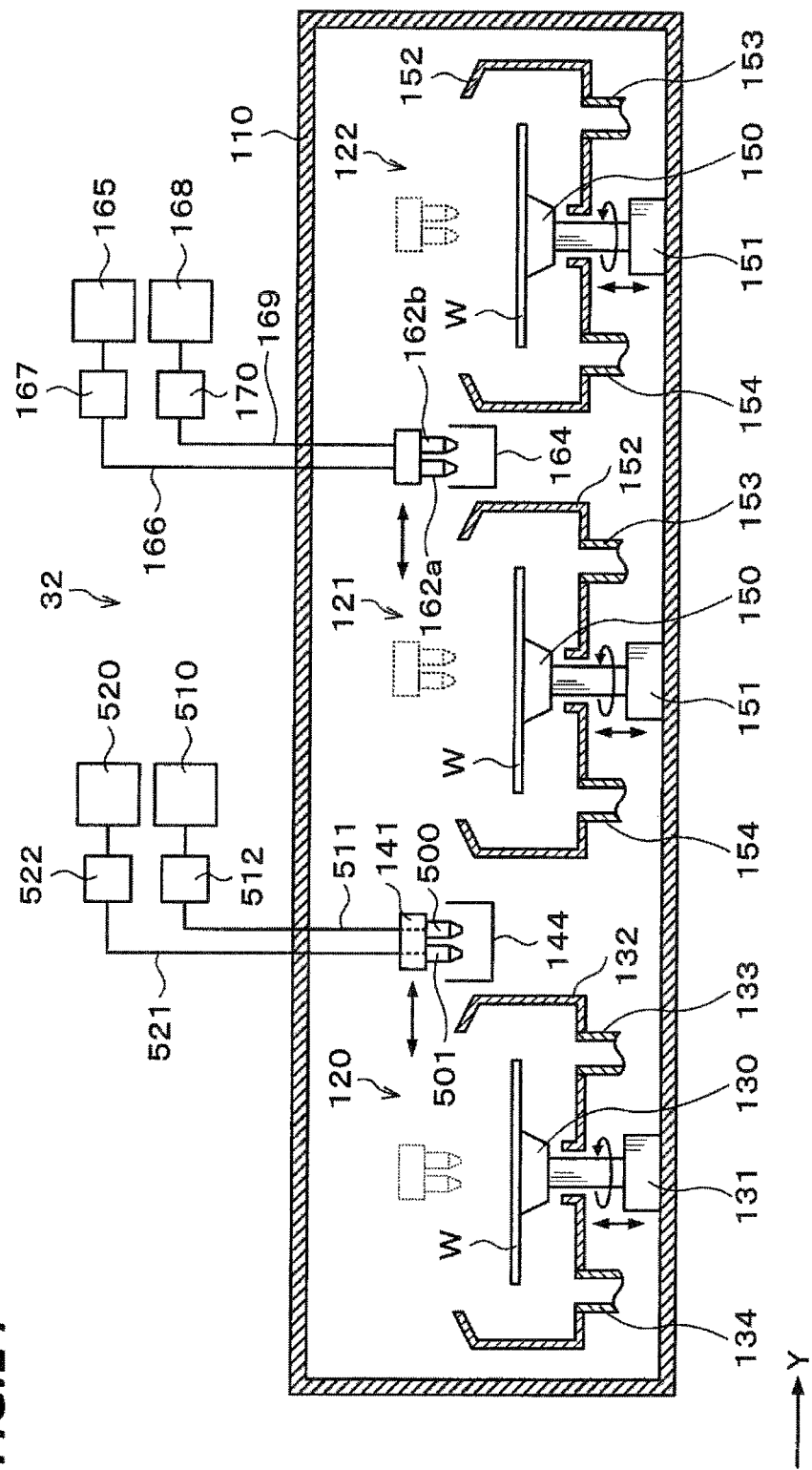
FIG. 14 is a vertical cross-sectional view illustrating the schematic configuration of the coating apparatus according to another exemplary embodiment.

In this case, as illustrated in FIGS. 13 and 14, an alcohol nozzle 500 functioning as a processing agent supplying unit and a metal-containing liquid nozzle 501 functioning as a metal-containing agent supplying unit are supported on the arm 141 of the metal processing unit 120 to supply a liquid alcohol onto the wafer W as the processing agent, and, to supply a liquid metal-containing liquid containing the metal 404 onto the wafer W as the metal-containing agent, respectively.

As illustrated in FIG. 14, a supply pipe 511 communicated with an alcohol supply source 510 is connected to the alcohol nozzle 500. A supply equipment group 512 including, for example, a valve or a flow rate adjusting unit that controls the flow rate of alcohol, is provided in the supply pipe 511. In the meantime, for example, IPA (isopropyl alcohol), ethanol, butanol, or MIBC (methyl isobutyl carbinol) is used as the alcohol.

A supply pipe 521 communicated with a metal-containing liquid supply source 520 is connected to a metal-containing liquid nozzle 501. A supply equipment group 522 including, for example, a valve or a flow rate adjusting unit that controls the flow rate of alcohol, is provided in the supply pipe 521. In the meantime, the metal which is the same as that in the exemplary embodiment described above is used as the metal 404 in the metal-containing liquid, and various solvents may be used as the solvent for the metal 404. Various materials such as, for example, deionized water, may be used as the solvent as long as the materials dissolves the metal 404 but does not dissolve the resist film.

Other constitutional elements of the metal processing unit 120 are the same as those of the metal processing unit 120 and thus descriptions thereof will be omitted. In the meantime, in the configuration described above, the alcohol nozzle 500 and the metal-containing liquid nozzle 501 are supported on the same arm 141, but may be supported on separate arms, respectively.

In the metal processing unit 120 of the present exemplary embodiment, the alcohol nozzle 500 of the standby section 144 is moved to a position above the central portion of the wafer after the wafer W is attracted to and held on the spin chuck 150. Subsequently, the alcohol is supplied onto the central portion of the wafer W from the alcohol nozzle 500 while the wafer W is rotated by the spin chuck 150. The alcohol supplied onto the wafer W is diffused over the entire surface of the wafer W due to the centrifugal force generated by rotation of the wafer W.

As described above, when the alcohol is applied onto the wafer W, the alcohol enters the resist pattern 402, targeting binding hands having a good affinity such as, for example, the cut side chains of the resist pattern 402.

Thereafter, the metal-containing liquid nozzle 501 is moved to a position above the central portion of the wafer W by the arm 141. Subsequently, the metal-containing liquid is supplied onto the central portion of the wafer W from the metal-containing liquid nozzle 501 while rotating the wafer W by the spin chuck 130. The metal-containing liquid supplied onto the wafer W is diffused over the entire surface of the wafer W due to the centrifugal force generated by rotation of the wafer W.

Figure 10:
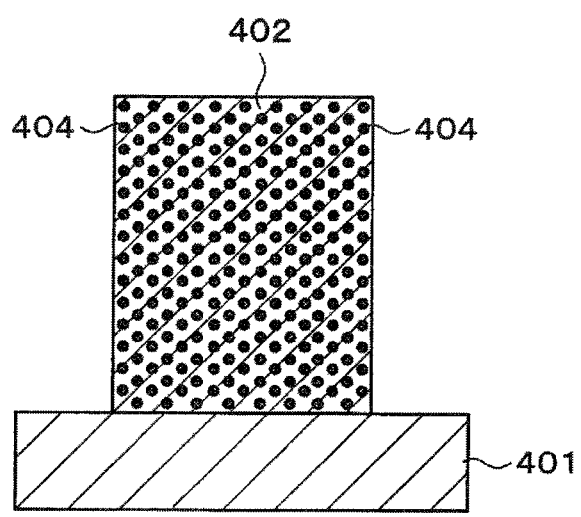
FIG. 10 is an explanatory view illustrating a situation where a metal is infiltrated into the resist pattern.

When the metal-containing liquid is applied onto the wafer W as described above, the metal-containing liquid enters the resist pattern 402 using the alcohol in the resist pattern 402 as an entering pathway. Also, the metal 404 in the metal-containing liquid bonds with the cut side chains of the resist pattern 402 and is infiltrated into the resist pattern 402 as illustrated in FIG. 10. Thereafter, the wafer W is subjected to the heat treatment to evaporate the alcohol such that the cured resist pattern as illustrated in FIG. 11 may be suitably formed on the wafer W. Accordingly, even when the alcohol and the metal 404 are supplied separately, the same effect as that of the exemplary embodiment described above may be achieved.

In the exemplary embodiment described above, the processing agent supplied from the processing liquid nozzle 142 to the wafer W is a liquid processing agent but may be a gaseous processing agent. That is, the processing agent such as, for example, the metal alkoxide may be supplied in a gaseous state. Descriptions will be made on the coating apparatus for a case where the liquid processing agent is supplied.

Figure 15:
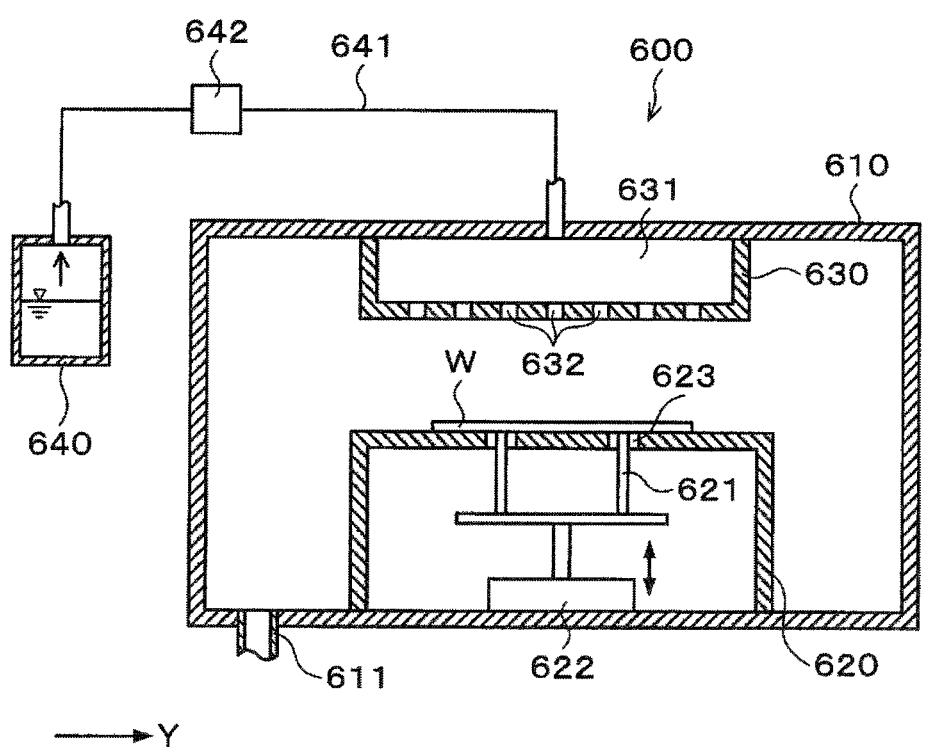
FIG. 15 is a vertical cross-sectional view illustrating a schematic configuration of a coating apparatus according to still another exemplary embodiment.

As illustrated in FIG. 15, a coating apparatus 600 includes a processing container 610 of which the inside is closable. A carry-in/carry-out port (not illustrated) of the wafer W is formed on the side surface at the wafer conveyance region D side of the processing container 610, and an opening/closing shutter is provided in the carry-in/carry-out port (not illustrated). An exhaust pipe 611 which exhausts atmosphere of the inside of the processing container 610 is connected to the bottom surface of the processing container 610.

A placing table 620 on which the wafer W is disposed is provided on the bottom surface within the processing container 610. A plurality of elevation pins 621, for example, three elevation pins 621 are provided within the placing table 620 to support a wafer W under the wafer and elevate the wafer W. The elevation pins 621 may be vertically moved by the elevation driving unit 622. Through holes 623 which penetrate the top surface of the placing table 620 are formed at, for example, three locations on the top surface. Also, the elevation pins 621 are configured to be insert through the through holes 623, respectively.

As a ceiling surface within the processing container 610, a shower head 630 is provided above the placing table 620 to supply a gaseous processing agent downwardly onto the wafer W. The shower head 630 is disposed to face the wafer W disposed on the placing table 620. An internal space 631 is formed inside of the shower head 630, in which the processing agent supplied from a processing agent supply source 640 (which will be described later) is introduced into the internal space 631. On the bottom surface of the shower head 630, a plurality of supply ports 632 are formed to be distributed across the entire bottom surface of the shower head 630 so as to supply the processing agent introduced into the internal space 631 downwardly. That is, the plurality of supply ports 632 are formed such that the liquid processing agent is uniformly supplied from the shower head 630 to the wafer W in a horizontal plane.

A supply pipe 641 communicated with the processing agent supply source 640 is connected to the shower head 630. In the inside of the processing agent supply source 640, for example, the metal alkoxide as the processing agent is stored in a liquid state, and the liquid processing agent is heated and vaporized, to generate the processing agent in the gaseous state. A supply equipment group 642 including, for example, a valve or a flow rate adjusting unit that controls the flow of the processing liquid, is provided in the supply pipe 641.

In this case, the wafer W formed with the resist pattern 402 is conveyed to the coating apparatus 600 by the wafer conveyance apparatus 70. When the wafer W is carried into the coating apparatus 600, the wafer W is delivered to the elevation pin 621 which is elevated in the standby state in advance. Subsequently, the elevation pin 621 is lowered to place the wafer W on the placing table 620. Thereafter, the liquid processing agent is supplied from the shower head 630 onto the wafer W. In this case, the processing agent enters the resist pattern 402 and the metal 404 enters the resist pattern using the processing agent as an entering pathway. In this manner, the metal 404 may be infiltrated into the resist pattern 402. In the meantime, when the processing agent is supplied in the liquid state, the cleaning process after the supply of the processing agent is unnecessary.

Similarly, although the alcohol 530 and the metal-containing liquid are respectively supplied from the alcohol nozzle 500 and the metal-containing liquid nozzle 501 to the wafer W in the liquid state, they may be supplied in a gaseous state. Even in such a case, an apparatus such as, for example, the coating apparatus 600 is utilized and the gaseous alcohol 530 and the gaseous metal-containing agent may be supplied onto the wafer W to cause the metal 404 to be infiltrated into the resist pattern 402.

In the exemplary embodiment described above, the metal processing unit 120, the cleaning processing unit 121, and the resist film forming unit 122 are provided within the same coating apparatus 32, but may be provided in separate apparatuses.

In the exemplary embodiment described above, when the processing agent and the metal-containing liquid are individually supplied, alcohol is used as the processing agent for allowing the metal 404 to enter the resist pattern 402, but the processing agent is not limited to the alcohol as long as the processing agent is the material infiltrated into the resist pattern 402.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:
1. A substrate processing method comprising:
   a resist pattern forming process of forming a resist pattern on a substrate by performing a photolithography processing on the substrate;
   a side chain cutting process of cutting side chains of the resist pattern by irradiating energy ray on the resist pattern; and a metal processing process of causing a processing agent to enter the resist pattern whose side chains have been cut, and causing a metal to be infiltrated into the resist pattern through the processing agent.

2. The substrate processing method of claim 1, wherein the energy ray is at least one of ultraviolet ray and electron beam which have a wavelength of 184 nm or less.

3. The substrate processing method of claim 1, wherein the irradiation of the energy ray is performed within an oxygen atmosphere.

4. The substrate processing method of claim 1, wherein an infiltration amount of the metal infiltrated into the resist pattern is controlled by adjusting at least one of: a time period during which the metal is infiltrated into the metal in the metal processing process, a temperature of the processing agent in the metal processing process, an amount of solvent contained in the resist pattern processed in the metal processing process, and an irradiation amount of the energy ray irradiated in the side chain cutting process.

5. The substrate processing method of claim 1, wherein the processing agent is at least one of a metal alkoxide, a metal acylate, and a metal chelate.

6. The substrate processing method of claim 1, wherein, in the metal processing process, the processing agent is supplied onto the substrate in a liquid state or a gaseous state.

7. The substrate processing method of claim 1, wherein, in the metal processing process, the processing agent is supplied onto the substrate to cause the processing agent to enter the resist pattern, and then a metal-containing agent containing the metal is supplied onto the substrate to cause the metal to be infiltrated into the resist pattern.

8. The substrate processing method of claim 7, wherein the processing agent is alcohol.

9. The substrate processing method of claim 7, wherein, in the metal processing process, each of the processing agent and the metal-containing agent is supplied onto the substrate in a liquid state or a gaseous state.

10. A computer-readable storage medium stored with a program, wherein the program runs on a computer of a control device that controls a substrate processing system to execute the substrate processing method according to claim 1.

11. A substrate processing system comprising:
a developing apparatus configured to perform a development processing on a resist film after an exposure apparatus to form a resist pattern on a substrate;
an energy ray irradiation apparatus configured to irradiate energy ray onto the resist pattern to cut side chains of the resist pattern; and
a metal processing apparatus configured to cause a processing agent to enter the resist pattern and to cause a metal to be infiltrated into the resist pattern through the processing agent.

12. The substrate processing system of claim 11, wherein the energy ray is at least one of ultraviolet ray and electron beam which have a wavelength of 184 nm or less.

13. The substrate processing system of claim 11, wherein the irradiation of the energy ray is performed within an oxygen atmosphere.

14. The substrate processing system of claim 11, further comprising a control device configured to control at least one of: an amount of infiltration of the metal infiltrated the resist pattern by adjusting at least a time period during which the metal is infiltrated into the resist in the metal processing process, a temperature of the processing agent in the metal processing process, an amount of solvent contained in the resist pattern processed in the metal processing process, and an irradiation amount of the energy ray irradiated in the side chain cutting process.

15. The substrate processing system of claim 11, wherein the processing agent is at least one of a metal alkoxide, a metal acylate, and a metal chelate.

16. The substrate processing system of claim 11, wherein the metal processing apparatus includes a processing agent supplying unit configured to supply the processing agent onto the substrate.

17. The substrate processing system of claim 16, wherein the processing agent is supplied onto the substrate in a liquid state or a gaseous state in the metal processing process.

18. The substrate processing system of claim 11, wherein the metal processing apparatus includes a processing agent supplying unit configured to supply the processing agent onto the substrate and a metal-containing agent supplying unit configured to supply a metal-containing agent containing the metal onto the substrate.

19. The substrate processing system of claim 18, wherein the processing agent supplying unit and the metal-containing agent supplying unit respectively supply the processing agent and the metal-containing agent onto the substrate in a liquid state or gaseous state.

20. The substrate processing system of claim 18, wherein the processing agent is alcohol.

* * * * *